United States Patent
Hattori

(10) Patent No.: US 6,791,483 B2
(45) Date of Patent: Sep. 14, 2004

(54) PARALLEL/SERIAL CONVERSION CIRCUIT, SERIAL DATA GENERATION CIRCUIT, SYNCHRONIZATION SIGNAL GENERATION CIRCUIT, CLOCK SIGNAL GENERATION CIRCUIT, SERIAL DATA TRANSMISSION DEVICE, SERIAL DATA RECEPTION DEVICE, AND SERIAL DATA TRANSMISSION SYSTEM

(75) Inventor: Shinji Hattori, Higashiosaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/601,572

(22) Filed: Jun. 24, 2003

(65) Prior Publication Data

US 2004/0004564 A1 Jan. 8, 2004

(30) Foreign Application Priority Data

Jun. 24, 2002 (JP) .......................... 2002-183704

(51) Int. Cl.$^7$ .......................... H03M 9/00; G06F 13/12; G06F 13/38
(52) U.S. Cl. .......................... 341/101; 710/71
(58) Field of Search .................. 341/101, 100; 377/79; 710/71

(56) References Cited

U.S. PATENT DOCUMENTS 4,418,418 A * 11/1983 Aoki .......................... 377/79
5,247,652 A * 9/1993 Uda .......................... 710/71
5,982,309 A * 11/1999 Xi et al. .................. 341/101
6,169,500 B1 * 1/2001 Eriksson et al. ............ 341/100
6,335,696 B1 * 1/2002 Aoyagi et al. ............... 341/100

FOREIGN PATENT DOCUMENTS

EP           397358     * 11/1990
JP          10-322404     12/1998

* cited by examiner

Primary Examiner—Patrick Wamsley
(74) Attorney, Agent, or Firm—Harness, Dickey & Pierce, P.L.C.

(57) ABSTRACT

A parallel/serial conversion circuit is provided, which comprises a parallel/serial conversion section for converting first parallel data to first serial data and converting second parallel data to second serial data, and a shift clock signal generation section for generating a shift clock signal. The parallel/serial conversion section converts the first parallel data to the first serial data by shifting the first parallel data in response to the shift clock signal. The parallel/serial conversion section converts the second parallel data to the second serial data by shifting the second parallel data in response to the shift clock signal. A combination of the first serial data and the second serial data indicates bit separation, a logic value '0', or a logic value '1'. The shift clock signal generation section generates the shift clock signal by combining the first serial data and the second serial data.

10 Claims, 7 Drawing Sheets

PARALLEL/SERIAL CONVERSION CIRCUIT, SERIAL DATA GENERATION CIRCUIT, SYNCHRONIZATION SIGNAL GENERATION CIRCUIT, CLOCK SIGNAL GENERATION CIRCUIT, SERIAL DATA TRANSMISSION DEVICE, SERIAL DATA RECEPTION DEVICE, AND SERIAL DATA TRANSMISSION SYSTEM

BACKGROUND OF THE INVENTION

1. Field of the Invention

The present invention relates to parallel/serial conversion circuit for converting parallel data to serial data, and a serial data generation circuit, a synchronization signal generation circuit, a clock signal generation circuit, a serial data transmission device, a serial data reception device, and a serial data transmission system. The parallel/serial conversion circuit may comprise a CMOS logic circuit. The parallel/serial conversion circuit may be used as a serial data transmission output circuit in an integrated circuit (e.g., a microprocessor, a digital signal processor, and the like).

2. Description of the Related Art

A serial data transmission device comprises a parallel/serial conversion circuit. The parallel/serial conversion circuit comprises a shift register. Parallel data containing a plurality of bits is written into the shift register. A shift clock signal is input to the shift register. The shift register shifts the parallel data containing a plurality of bits in response to the input shift clock signal. The plurality of bits are shifted on a bit-by-bit basis so that a signal indicating each bit is serially output from the shift register, resulting in serial data containing the plurality of bits. A serial data signal indicating the serial data is input to a serial data reception device.

A serial data transmission system comprises a serial data transmission device, a serial data reception device, two transmission paths connecting the serial data transmission device and the serial data reception device. One of the transmission paths is used to transmit a serial data signal from the serial data transmission device to the serial data reception device. The other transmission path is used to transmit a signal for separating one bit from another in a plurality of bits contained in serial data signal, from the serial data transmission device to the serial data reception device.

A signal for separating one bit from another bit in a plurality of bits contained serial data, includes other signals in addition to a shift clock signal.

Japanese Laid-Open Publication No. 10-322404 discloses a serial data transmission method which uses a signal for separating one bit from another bit in a plurality of bits contained serial data, other than a shift clock signal.

FIG. 7 shows signal waveforms for explaining a serial data transmission method as disclosed in Japanese Laid-Open Publication No. 10-322404.

This serial data transmission method uses a serial data transmission system which comprises a serial data transmission device, a serial data reception device, and two transmission paths connecting the serial data transmission device and the serial data reception device. One of the two transmission paths (first transmission path) is used to transmit a serial data signal 200 from the serial data transmission device to the serial data reception device. The other transmission path (second transmission path) is used to transmit a separation signal 201 from the serial data transmission device to the serial data reception device. Serial data indicated by the serial data signal 200 contains a plurality of bits. The separation signal 201 is used to separate one bit from another in a plurality of bits contained in the serial data.

The serial data transmission device transmits the serial data signal 200 from the serial data transmission device to the serial data reception device via the first transmission path. A signal indicating each bit contained in serial data is transmitted as a sequence of logic values '0' or '1' where two different voltage levels of the signal indicate the respective logic values. When two bits having the same logic value are consecutively output as the serial data signal 200 from the serial data transmission device, the serial data transmission device transmits a separation signal 201 having a predetermined voltage level from the serial data transmission device to the serial data reception device via the second transmission path.

However, conventional serial data transmission systems have the following problems.

(1) Conventional parallel/serial conversion circuits require a clock generation circuit, a clock division circuit, and the like. This is because it is necessary to process a shift clock signal for generating serial data externally input to a parallel/serial conversion circuit. Therefore, the size of conventional parallel/serial conversion circuits is inevitably large.

(2) Conventional parallel/serial conversion circuits results in wasted power consumption. This is because no matter whether or not the conventional parallel/serial conversion circuit performs parallel/serial conversion, the clock generation circuit, the clock division circuit, and the like are operated due to the shift clock signal externally supplied to the parallel/serial conversion circuit.

When a conventional parallel/serial conversion circuit does not perform parallel/serial conversion, the supply of a shift clock signal may not be stopped so as to reduce wasted power consumption. However, such a conventional parallel/serial conversion circuit requires a control circuit for stopping the external supply of a shift clock signal. Therefore, the size of the conventional parallel/serial conversion circuit is inevitably increased.

(3) Conventional serial data transmission systems require a transmission path for transmitting a signal for separating one bit from another in a plurality of bits contained in serial data. This is because a serial data reception device converts a serial data signal to a parallel data signal.

SUMMARY OF THE INVENTION

According to an aspect of the present invention, a parallel/serial conversion circuit is provided, which comprises: a parallel/serial conversion section for converting first parallel data to first serial data and converting second parallel data to second serial data; and a shift clock signal generation section for generating a shift clock signal. The parallel/serial conversion section converts the first parallel data to the first serial data by shifting the first parallel data in response to the shift clock signal. The parallel/serial conversion section converts the second parallel data to the second serial data by shifting the second parallel data in response to the shift clock signal. A combination of the first serial data and the second serial data indicates bit separation, a logic value '0', or a logic value '1'. The shift clock signal generation section generates the shift clock signal by combining the first serial data and the second serial data.

In one embodiment of this invention, the parallel/serial conversion section may comprise a first shift register, a second shift register, a first pulse generation circuit, and a second pulse generation circuit. The first and second parallel data may each contain a plurality of bits. The first serial data and second serial data may be inverse to each other in terms of the bit value. The first shift register may shift the first parallel data stored therein on a bit-by-bit basis in response to the shift clock signal to convert the first parallel data to third serial data. The second shift register may shift the second parallel data stored therein on a bit-by-bit basis in response to the shift clock signal to convert the second parallel data to fourth serial data. The first pulse generation circuit may receive the third serial data and converts the third serial data to the first serial data based on each bit contained in the third serial data. The second pulse generation circuit may receive the fourth serial data and converts the fourth serial data to the second serial data based on each bit contained in the fourth serial data.

In one embodiment of this invention, a signal indicating the first serial data may contain a first end data signal indicating an end of the first serial data, and a signal indicating the second serial data may contain a second end data signal indicating an end of the second serial data.

In one embodiment of this invention, the parallel/serial conversion circuit further may comprise a delay circuit for determining a delay time of the shift clock signal.

According to another aspect of the present invention, a serial data generation circuit for generating serial data containing a plurality of bits is provided, which comprises: a serial data generation section for combining first serial data and second serial data generated by a parallel/serial conversion circuit to generate the serial data. A serial data signal indicating the serial data includes a signal for separating one bit from another in the plurality of bits contained in the serial data. The parallel/serial conversion circuit comprises: a parallel/serial conversion section for generating the first serial data by converting first parallel data to the first serial data and generating the second serial data by converting second parallel data to the second serial data; and a shift clock signal generation section for generating a shift clock signal. The parallel/serial conversion section converts the first parallel data to the first serial data by shifting the first parallel data in response to the shift clock signal. The parallel/serial conversion section converts the second parallel data to the second serial data by shifting the second parallel data in response to the shift clock signal. A combination of the first serial data and the second serial data indicates bit separation, a logic value '0', or a logic value '1'. The shift clock signal generation section generates the shift clock signal by combining the first serial data and the second serial data.

According to another aspect of the present invention, a synchronization signal generation circuit for generating a synchronization signal indicating an end of serial data is provided, in which the serial data is generated by combining first serial data and second serial data generated by a parallel/serial conversion circuit. The synchronization signal generation circuit comprises: a synchronization signal generation section for generating the synchronization signal based on a combination of a first end data signal contained in a signal indicating the first serial data and a second end data signal contained in a signal indicating the second serial data. The first end data signal indicates an end of the first serial data and the second end data signal indicates an end of the second serial data. The parallel/serial conversion circuit comprises: a parallel/serial conversion section for generating the first serial data by converting first parallel data to the first serial data and generating the second serial data by converting second parallel data to the second serial data; and a shift clock signal generation section for generating a shift clock signal. The parallel/serial conversion section converts the first parallel data to the first serial data by shifting the first parallel data in response to the shift clock signal. The parallel/serial conversion section converts the second parallel data to the second serial data by shifting the second parallel data in response to the shift clock signal. A combination of the first serial data and the second serial data indicates bit separation, a logic value '0', or a logic value '1'. The shift clock signal generation section generates the shift clock signal by combining the first serial data and the second serial data.

According to another aspect of the present invention, a clock signal generation circuit for generating a clock signal is provided, in which the clock signal separates one bit from another in a plurality of bits contained in serial data, and the serial data is generated by combining first serial data and second serial data generated by a parallel/serial conversion circuit. The clock signal generation circuit comprising: a clock signal generation section for generating the clock signal based on a combination of a first pulse signal contained in a signal indicating the first serial data and a second pulse signal contained in a signal indicating the second serial data. The first pulse signal and the second pulse signal separate one bit from another in a plurality of bits contained in the serial data. The parallel/serial conversion circuit comprises: a parallel/serial conversion section for generating the first serial data by converting first parallel data to the first serial data and generating the second serial data by converting second parallel data to the second serial data; and a shift clock signal generation section for generating a shift clock signal. The parallel/serial conversion section converts the first parallel data to the first serial data by shifting the first parallel data in response to the shift clock signal. The parallel/serial conversion section converts the second parallel data to the second serial data by shifting the second parallel data in response to the shift clock signal. A combination of the first serial data and the second serial data indicates bit separation, a logic value '0', or a logic value '1'. The shift clock signal generation section generates the shift clock signal by combining the first serial data and the second serial data.

According to another aspect of the present invention, a serial data transmission device is provided, which comprises a parallel/serial conversion circuit comprising a parallel/serial conversion section for converting first parallel data to first serial data and converting second parallel data to second serial data; and a shift clock signal generation section for generating a shift clock signal. The parallel/serial conversion section converts the first parallel data to the first serial data by shifting the first parallel data in response to the shift clock signal. The parallel/serial conversion section converts the second parallel data to the second serial data by shifting the second parallel data in response to the shift clock signal. A combination of the first serial data and the second serial data indicates bit separation, a logic value '0', or a logic value '1'. The shift clock signal generation section generates the shift clock signal by combining the first serial data and the second serial data.

According to another aspect of the present invention, a serial data reception device is provided, which comprises: a serial data generation circuit for generating serial data containing a plurality of bits; a synchronization signal generation circuit for generating a synchronization signal indicating an end of the serial data; and a clock signal generation circuit for generating a clock signal. The serial data generation circuit generates the serial data by combining the first serial data and the second serial data generated by a parallel/serial conversion circuit. A serial data signal indicating the serial data includes a bit separation signal separating one bit from another in the plurality of bits contained in the serial data. The synchronization signal generation circuit generates the synchronization signal based on a combination of the first end data signal contained in a signal indicating the first serial data and a second end data signal contained in a signal indicating the second serial data. The first end data signal indicates an end of the first serial data and the second end data signal indicates an end of the second serial data. The clock signal generation circuit generates the clock signal based on a combination of a first pulse signal contained in the signal indicating the first serial data and a second pulse signal contained in the signal indicating the second serial data. The clock signal separates one bit from another in the plurality of bits contained in the serial data. The first pulse signal and the second pulse signal separate one bit from another in a plurality of bits contained in the serial data. The parallel/serial conversion circuit comprises: a parallel/serial conversion section for generating the first serial data by converting first parallel data to the first serial data and generating the second serial data by converting second parallel data to the second serial data; and a shift clock signal generation section for generating a shift clock signal. The parallel/serial conversion section converts the first parallel data to the first serial data by shifting the first parallel data in response to the shift clock signal. The parallel/serial conversion section converts the second parallel data to the second serial data by shifting the second parallel data in response to the shift clock signal. A combination of the first serial data and the second serial data indicates bit separation, a logic value '0', or a logic value '1'. The shift clock signal generation section generates the shift clock signal by combining the first serial data and the second serial data.

According to another aspect of the present invention, a serial data transmission system is provided, which comprises: a serial data transmission device comprising a parallel/serial conversion circuit for generating first serial data and second serial data; a serial data reception device for receiving the first serial data and the second serial data; a first transmission path for transmitting the first serial data from the serial data transmission device to the serial data reception device; and a second transmission path for transmitting the second serial data from the serial data reception device to the serial data transmission device. The parallel/serial conversion circuit comprises: a parallel/serial conversion section for generating the first serial data by converting first parallel data to the first serial data and generating the second serial data by converting second parallel data to the second serial data; and a shift clock signal generation section for generating a shift clock signal. The parallel/serial conversion section converts the first parallel data to the first serial data by shifting the first parallel data in response to the shift clock signal, the parallel/serial conversion section converts the second parallel data to the second serial data by shifting the second parallel data in response to the shift clock signal, a combination of the first serial data and the second serial data indicates bit separation, a logic value '0', or a logic value '1', and the shift clock signal generation section generates the shift clock signal by combining the first serial data and the second serial data. The serial data reception device comprises a serial data generation circuit for generating serial data containing a plurality of bits, a synchronization signal generation circuit for generating a synchronization signal indicating an end of the serial data, and a clock signal generation circuit for generating a clock signal. The serial data generation circuit generates the serial data by combining the first serial data and the second serial data. A serial data signal indicating the serial data includes a bit separation signal separating one bit from another in the plurality of bits contained in the serial data. The synchronization signal generation circuit generates the synchronization signal based on a combination of the first end data signal contained in a signal indicating a first serial data and a second end data signal contained in a signal indicating the second serial data. The first end data signal indicates an end of the first serial data and the second end data signal indicates an end of the second serial data. The clock signal generation circuit generates the clock signal based on a combination of a first pulse signal contained in the signal indicating the first serial data and a second pulse signal contained in the signal indicating the second serial data. The clock signal separates one bit from another in the plurality of bits contained in the serial data. The first pulse signal separates and the second pulse signal separate one bit from another in a plurality of bits contained in the serial data.

Hereinafter, functions of the present invention will be described.

The parallel/serial conversion circuit of the present invention combines first serial data and second serial data, a combination of which indicates bit separation, a logic value '0', or a logic value '1', to generate a shift clock signal. The parallel/serial conversion circuit of the present invention shifts the first parallel data in response to the generated shift clock signal, thereby converting the first parallel data to first serial data. Also, the parallel/serial conversion circuit of the present invention shifts the second parallel data in response to the generated shift clock signal, thereby converting the second parallel data to second serial data.

As a result, the parallel/serial conversion circuit of the present invention can generate a shift clock signal by itself and convert parallel data to serial data in response to the generated shift clock signal.

According to the serial data reception device of the present invention, a synchronization signal and a clock signal can be generated based on a positive transmission data signal and a negative transmission data signal. Therefore, for example, serial data can be input serially into a shift register in response to the clock signal, thereby making it possible to output parallel data in response to the synchronization signal.

Thus, the invention described herein makes possible the advantages of a providing parallel/serial conversion circuit, a serial data generation circuit, a synchronization signal generation circuit, a clock signal generation circuit, a serial data transmission device, a serial data reception device, and a serial data transmission system, which (1) can produce a shift clock signal without a clock generation circuit, a clock division circuit, and the like, (2) can reduce power consumption when parallel/serial conversion is not performed, and (3) can transmit serial data without a transmission path for transmitting a signal for separating one bit from another in a plurality of bits in the serial data.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

(Embodiment 1 )

In Embodiment 1 of the present invention, a parallel/serial conversion circuit for performing parallel/serial conversion for 8-bit data.

Figure 1:
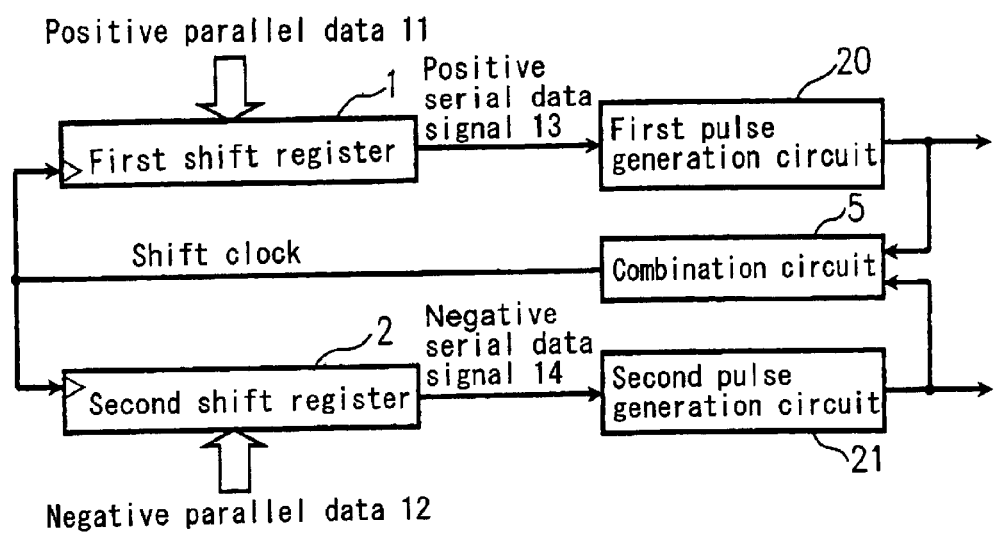
FIG. 1 is a diagram showing a structure of a parallel/serial conversion circuit 100 according to Embodiment 1 of the present invention.

FIG. 1 shows a structure of a parallel/serial conversion circuit 100 according to Embodiment 1 of the present invention.

The parallel/serial conversion circuit 100 comprises a first shift register 1, a second shift register 2, a first pulse generation circuit 20, a second pulse generation circuit 21, and a combination circuit 5. 8-bit positive parallel data 11 is written into the first shift register 1. 8-bit negative parallel data 12 is written into the second shift register 2. The value of each bit of the 8-bit negative parallel data 12 is a value obtained by inverting the value of the corresponding bit of the 8-bit positive parallel data 11.

For example, when the bit values of the 8-bit positive parallel data 11 are (0, 0, 1, 1, 1, 0, 1, 0), the bit values of the 8-bit negative parallel data 12 are (1, 1, 0, 0, 0, 1, 0, 1). The negative parallel data 12 may be obtained by inverting the bits of the positive parallel data 11 using an inverter circuit.

The first shift register 1 shifts the 8-bit positive parallel data 11 on a bit-by-bit basis in response to a shift clock signal. Thus, the 8-bit positive parallel data 11 is converted to positive serial data (positive serial data signal 13) which is output from the first shift register 1 to the first pulse generation circuit 20.

The second shift register 2 shifts the 8-bit negative parallel data 12 on a bit-by-bit basis in response to a shift clock signal. Thus, the 8-bit negative parallel data 12 is converted to negative serial data (negative serial data signal 14) which is output from the second shift register 2 to the second pulse generation circuit 21.

The first pulse generation circuit 20 generates a first pulse signal based on the positive serial data signal 13. The first pulse signal contains pulses corresponding to the respective bits of the 8-bit positive serial data 11. The second pulse generation circuit 21 generates a second pulse signal based on the negative serial data signal 14. The second pulse signal contains pulses corresponding to the respective bits of the 8-bit negative serial data 12.

The first pulse signal is output from the first pulse generation circuit 20 to the combination circuit 5. The second pulse signal is output from the second pulse generation circuit 21 to the combination circuit 5.

A combination of data indicated by the first pulse signal and data indicated by the second pulse signal indicates bit separation, a logic value '0', or a logic value '1'. For example, when a combination of the data indicated by the first pulse signal and the data indicated by the second pulse signal is (0, 0), bit separation is indicated; when (0, 1), a logic value '0' is indicated; and when (1, 0), a logic value '1' is indicated.

The combination circuit 5 combines the first pulse signal and the second pulse signal to generate a combination signal. The combination circuit 5 outputs the combination signal as a shift clock signal to the first shift register 1 and the second shift register 2.

The parallel/serial conversion circuit 100 does not require a clock generation circuit, a clock division circuit, or the like. This is because the first shift register 1 and the second shift register 2 contained in the parallel/serial conversion circuit 100 can use the combination signal generated by the combination circuit 5 as a shift clock signal. In addition, when the parallel/serial conversion circuit 100 does not perform parallel/serial conversion, the power consumption of the parallel/serial conversion circuit 100 can be reduced.

Figure 2A:
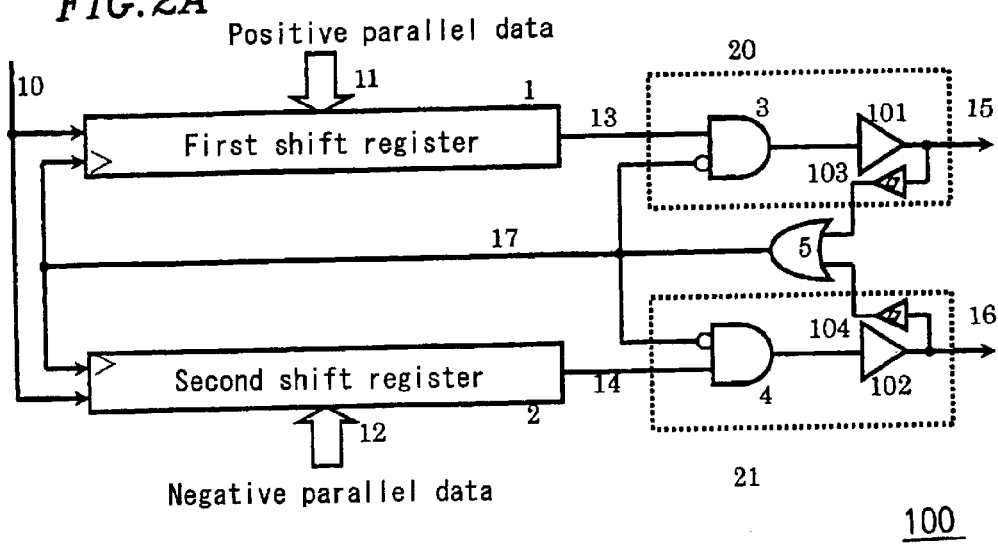
FIG. 2A is a diagram showing a detailed structure of the parallel/serial conversion circuit 100 of Embodiment 1 of the present invention.

FIG. 2A shows a detailed structure of the parallel/serial conversion circuit 100 of Embodiment 1 of the present invention.

The 8-bit positive parallel data 11 is written into the first shift register 1 in a parallel manner in response to a write pulse signal 10. The first shift register 1 generates the positive serial data signal 13 indicating 8-bit positive serial data based on the 8-bit positive parallel data 11. The positive serial data signal 13 generated by the first shift register 1 is output in a serial manner to the first pulse generation circuit 20.

The first pulse generation circuit 20 comprises a first AND circuit 3, a first drive circuit 101, and a first Schmidt trigger circuit 103.

The first AND circuit 3 comprises two input terminals.

When the positive serial data signal 13 output from the first shift register 1 is input to the first AND circuit 3 via one of the two input terminals and a signal indicating a logic value '0' is input to the first AND circuit 3 via the other input terminal, a signal indicating a logic value '0' is output from the first AND circuit 3 to the first drive circuit 101. When the positive serial data signal 13 output from the first shift register 1 is input to the first AND circuit 3 via one of the two input terminals and a signal indicating a logic value '1' is input to the first AND circuit 3 via the other input terminal, a signal indicating a logic value indicated by the positive serial data signal 13 is output from the first AND circuit 3 to the first drive circuit 101.

The first drive circuit 101 converts the voltage level of the received signal to a predetermined voltage level. A signal having the predetermined voltage level converted by the first drive circuit 101 is output as a positive transmission data signal 15 from the first drive circuit 101. The positive transmission data signal 15 is the first pulse signal.

The sum of a delay time caused by the first AND circuit 3 and a delay time caused by the first drive circuit 101 is referred to as a delay time T.

When a signal input to the first Schmidt trigger circuit 103 has a voltage level between a voltage level indicating the logic value '0' and a voltage level indicating the logic value '1', the first Schmidt trigger circuit 103 regulates the voltage level of the signal so that a logic value indicated by a signal output from the first Schmidt trigger circuit 103 holds a logic value indicated by a signal output by the first AND circuit 3.

The 8-bit negative parallel data 12 is written into the second shift register 2 in a parallel manner in response to a write pulse signal 10. The second shift register 2 generates the negative serial data signal 14 indicating 8-bit negative serial data based on the 8-bit negative parallel data 12. The negative serial data signal 14 generated by the second shift register 2 is output in a serial manner to the second pulse generation circuit 21. The value of each bit of the 8-bit negative parallel data 12 is obtained by inverting the value of the corresponding bit of the 8-bit positive parallel data 11. In other words, the negative parallel data 12 is inverse to the positive parallel data 11 in terms of the bit value. Therefore, data indicated by the positive serial data signal 13 is inverse to data indicated by the negative serial data signal 14 in terms of the bit value.

The second pulse generation circuit 21 comprises a second AND circuit 4, a second drive circuit 102, and a second Schmidt trigger circuit 104.

The second AND circuit 4 comprises two input terminals.

When the negative serial data signal 14 output from the second shift register 2 is input to the second AND circuit 4 via one of the two input terminals and a signal indicating a logic value '0' is input to the second AND circuit 4 via the other input terminal, a signal indicating a logic value '0' is output from the second AND circuit 4 to the second drive circuit 102. When the negative serial data signal 14 output from the second shift register 2 is input to the second AND circuit 4 via one of the two input terminals and a signal indicating a logic value '1' is input to the second AND circuit 4 via the other input terminal, a signal indicating a logic value indicated by the negative serial data signal 14 is output from the second AND circuit 4 to the second drive circuit 102.

The second drive circuit 102 converts the voltage level of the received signal to a predetermined voltage level. A signal having the predetermined voltage level converted by the second drive circuit 102 is output as a negative transmission data signal 16 from the second drive circuit 102. The negative transmission data signal 16 is the second pulse signal.

The sum of a delay time caused by the second AND circuit 4 and a delay time caused by the second drive circuit 102 is referred to as a delay time T.

When a signal input to the second Schmidt trigger circuit 104 has a voltage level between a voltage level indicating the logic value '0' and a voltage level indicating the logic value '1', the second Schmidt trigger circuit 104 regulates the voltage level of the signal so that a logic value indicated by a signal output from the second Schmidt trigger circuit 104 holds a logic value indicated by a signal output by the second AND circuit 4.

The positive transmission data signal 15 output from the first drive circuit 101 is input via the first Schmidt trigger circuit 103 to the combination circuit 5. The combination circuit 5 is, for example, an OR circuit. The negative transmission data signal 16 output from the second drive circuit 102 is input via the second Schmidt trigger circuit 104 to the combination circuit 5.

The combination circuit 5 combines the positive transmission data signal 15 received via the first Schmidt trigger circuit 103 and the negative transmission data signal 16 received via the second Schmidt trigger circuit 104 to generate a shift clock signal 17. The combination circuit 5 outputs the generated shift clock signal 17 to the first shift register 1, the second shift register 2, the first AND circuit 3 and the second AND circuit 4.

The first AND circuit 3 obtains the logical product of a logic value obtained by inverting a logic value indicated by the shift clock signal 17 and a logic value indicated by the positive serial data signal 13. The positive transmission data signal 15 is output from the first drive circuit 101 the delay time T after the shift clock signal 17 and the positive serial data signal 13 are input to the first AND circuit 3.

The second AND circuit 4 obtains the logical product of a logic value obtained by inverting a logic value indicated by the shift clock signal 17 and a logic value indicated by the negative serial data signal 14. The negative transmission data signal 16 is output from the second drive circuit 102 the delay time T after the shift clock signal 17 and the negative serial data signal 14 are input to the second AND circuit 4.

The value of each bit of the 8-bit negative parallel data 12 is obtained by inverting the value of the corresponding bit of the 8-bit positive parallel data 11. In other words, the negative parallel data 12 is inverse to the positive parallel data 11 in terms of the bit value. Therefore, data indicated by the positive serial data signal 13 is inverse to data indicated by the negative serial data signal 14 in terms of the bit value.

A combination of data indicated by the positive serial data signal 13 and data indicated by the negative serial data signal 14 indicates bit separation, a logic value '0', or a logic value '1'. For example, when a combination of the data indicated by the positive serial data signal 13 and the data indicated by the negative serial data signal 14 is (0, 0), bit separation is indicated; when (0, 1), a logic value '0' is indicated; and when (1, 0), a logic value '1' is indicated.

For example, in the embodiment of FIGS. 1 and 2A, the first shift register 1, the second shift register 2, the first pulse generation circuit 20 and the second pulse generation circuit 21 act as a "parallel/serial conversion section for converting first parallel data to first serial data and converting second parallel data to second serial data". Also, the combination circuit 5 acts as a "shift clock signal generation section for generating a shift clock signal by combining the first serial data and the second serial data". Note that the structure of the parallel/serial conversion circuit 100 is not limited to that which is shown in FIGS. 1 and 2A. The parallel/serial conversion circuit 100 may have any circuit configuration which can perform parallel/serial conversion and shift clock generation.

Hereinafter, a structure of the first shift register 1 and a structure of the second shift register 2 will be described.

Figure 3A:
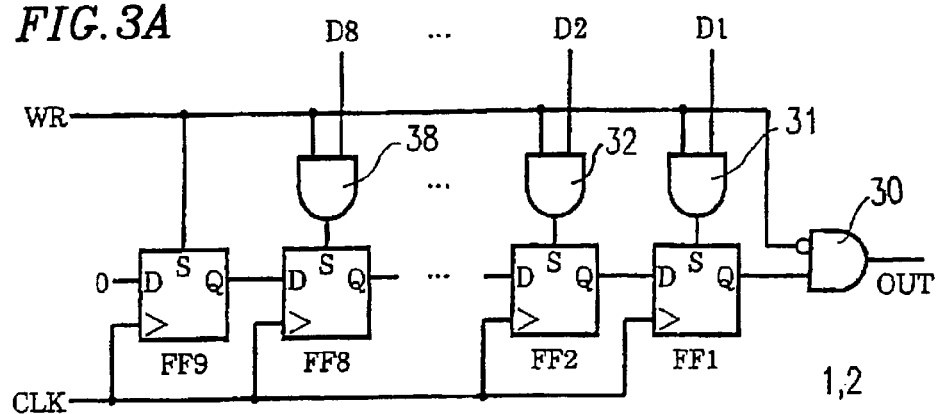
FIG. 3A is a diagram showing a structure of a first shift register 1 or a second shift register 2.

FIG. 3A shows a first shift register 1 or a second shift register 2.

The first shift register 1 comprises nine flip-flops FF1 to FF9, nine AND circuits 30 to 38, a write pulse signal line WR, and a shift clock signal line CLK.

Each of the flip-flops FF1 to FF9 comprises a data signal input terminal D, an asynchronous set terminal S, a clock signal input terminal, and a data signal output terminal Q. Each of the flip-flops FF1 to FF9 is connected to the shift clock signal line CLK. The shift clock signal 17 (FIGS. 2A and 2B) is input via the shift clock signal line CLK to each of the flip-flops FF1 to FF9. Note that a detailed structure of the flip-flops FF1 to FF9 will be described below with reference to FIG. 3B.

Each of the AND circuits 30 to 38 is connected to the write pulse signal line WR. The write pulse signal 10 (FIGS. 2A and 2B) is input via the write pulse signal line WR to each of the AND circuits 30 to 38.

The AND circuits 31 to 38 receive respective parallel data signals D1 to D8. The parallel data signals D1 to D8 indicate respective bits of the 8-bit positive parallel data 11.

The AND circuit 31 outputs a data signal, which indicates the logical product of a logic value indicated by the write pulse signal 10 and a logic value indicated by the parallel data signal D1, to the flip-flop FF1. The AND circuit 32 outputs a data signal, which indicates the logical product of a logic value indicated by the write pulse signal 10 and a logic value indicated by the parallel data signal D2, to the flip-flop FF2. The AND circuit 33 outputs a data signal, which indicates the logical product of a logic value indicated by the write pulse signal 10 and a logic value indicated by the parallel data signal D3, to the flip-flop FF3. The AND circuit 34 outputs a data signal, which indicates the logical product of a logic value indicated by the write pulse signal 10 and a logic value indicated by the parallel data signal D4, to the flip-flop FF4. The AND circuit 35 outputs a data signal, which indicates the logical product of a logic value indicated by the write pulse signal 10 and a logic value indicated by the parallel data signal D5, to the flip-flop FF5. The AND circuit 36 outputs a data signal, which indicates the logical product of a logic value indicated by the write pulse signal 10 and a logic value indicated by the parallel data signal D6, to the flip-flop FF6. The AND circuit 37 outputs a data signal, which indicates the logical product of a logic value indicated by the write pulse signal 10 and a logic value indicated by the parallel data signal D7, to the flip-flop FF7. The AND circuit 38 outputs a data signal, which indicates the logical product of a logic value indicated by the write pulse signal 10 and a logic value indicated by the parallel data signal D8, to the flip-flop FF8.

The data signals indicating the logical products output from the AND circuits 31 to 38 are input to the respective asynchronous set terminals S of the flip-flops FF1 to FF8.

The flip-flop FF9 is also connected to the write pulse signal line WR. The write pulse signal 10 is input via the write pulse signal line WR to the asynchronous set terminal S of the flip-flop FF9.

At the data signal input terminal D of the flip-flop FF9, the logic value is fixed to a value '0'.

The flip-flops FF1 to FF9 are connected to each other in series.

The data signal output terminal Q of the flip-flop FF9 is connected to the data signal input terminal D of the flip-flop FF8. The data signal output terminal Q of the flip-flop FF8 is connected to the data signal input terminal D of the flip-flop FF7. The data signal output terminal Q of the flip-flop FF7 is connected to the data signal input terminal D of the flip-flop FF6. The data signal output terminal Q of the flip-flop FF6 is connected to the data signal input terminal D of the flip-flop FF5. The data signal output terminal Q of the flip-flop FF5 is connected to the data signal input terminal D of the flip-flop FF4. The data signal output terminal Q of the flip-flop FF4 is connected to the data signal input terminal D of the flip-flop FF3. The data signal output terminal Q of the flip-flop FF3 is connected to the data signal input terminal D of the flip-flop FF2. The data signal output terminal Q of the flip-flop FF2 is connected to the data signal input terminal D of the flip-flop FF1.

The shift clock signal 17 (FIGS. 2A and 2B) is input via the shift clock signal line CLK to the clock signal input terminal of each of the flip-flops FF1 to FF9.

Figure 2B:
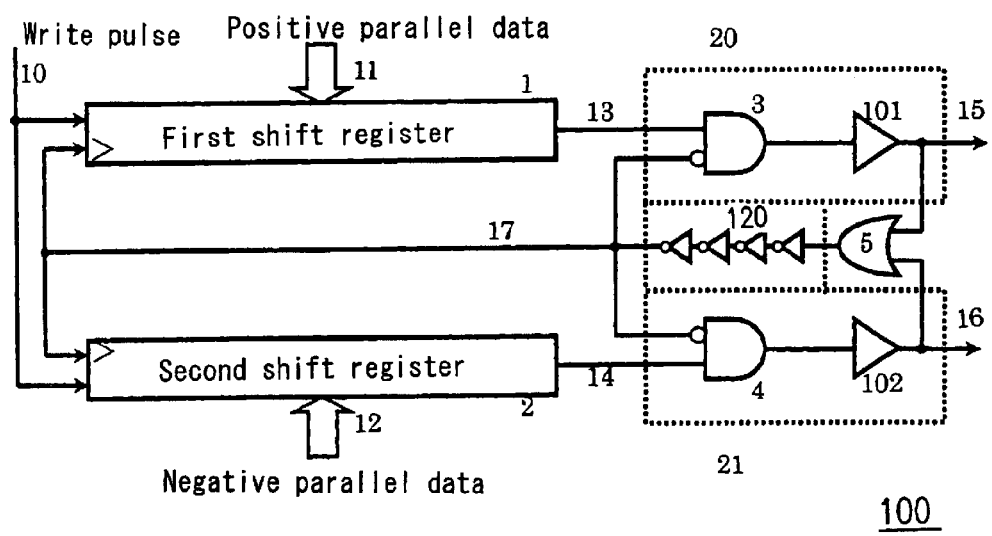
FIG. 2B is a diagram showing a structure of another parallel/serial conversion circuit 100' of Embodiment 1 of the present invention.

Data stored in each of the flip-flops FF2 to FF9 is shifted to an adjacent flip-flop in synchronization with the shift clock signal 17 (FIGS. 2A and 2B). A signal indicating data stored in the flip-flop FF1 is output via the data signal output terminal Q of the flip-flop FF1 to the AND circuit 30 in synchronization with the shift clock signal 17. The AND circuit 30 outputs a serial output signal OUT. The serial output signal OUT indicates the logical product of a logic value obtained by inverting a logic value indicated by the write pulse signal 10 and a logic value indicated by a data signal output by the flip-flop FF1.

Note that the number of flip-flops and the number of AND circuits contained in the first shift register 1 are not each limited to 9. The number of flip-flops and the number of AND circuits contained in the first shift register 1 may be dependent of the number of bits contained in the positive parallel data 11 which is written into the first shift register 1. For example, when the number of bits in the positive parallel data 11 is 16, the number of flip-flops and the number of AND circuits contained in the first shift register 1 are each 17. For example, the number of bits in the positive parallel data 11 is N, the number of flip-flops and the number of AND circuits contained in the first shift register 1 are each (N+1).

The structure of the second shift register 2 is the same as that of the first shift register 1. The 8 AND circuits contained in the second shift register 2 receive eight respective parallel data signals. The eight parallel data signals indicate the respective bits of the 8-bit negative parallel data 12. The value of each bit of the 8-bit negative parallel data 12 is a bit value obtained by inverting the value of the corresponding bit of the 8-bit positive parallel data 11. The negative parallel data 12 is obtained by inverting the bits of the positive parallel data 11.

Figure 3B:
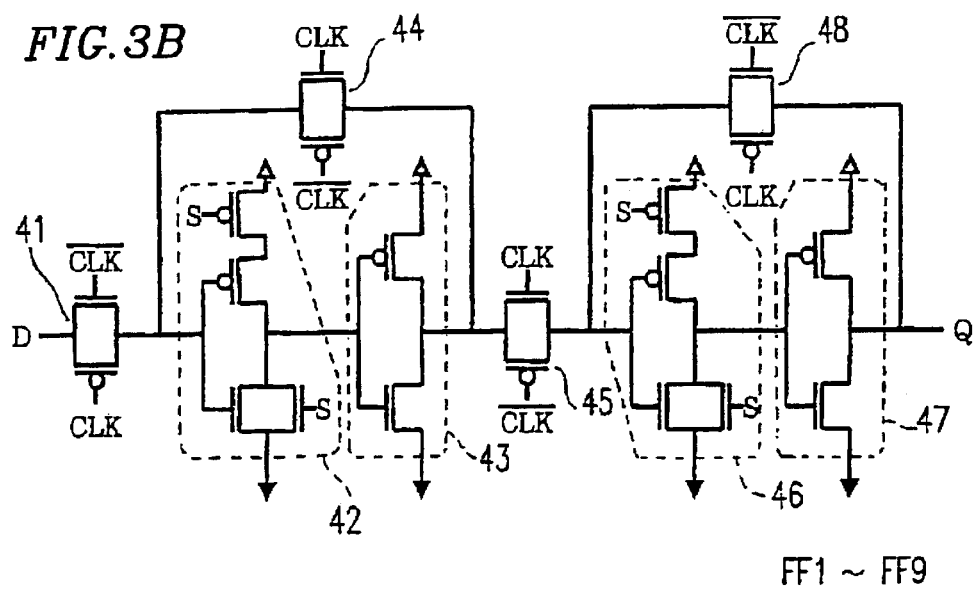
FIG. 3B is a diagram showing a detailed structure of a flip-flop contained in the first shift register 1 and the second shift register 2.

FIG. 3B shows a detailed structure of the flip-flop contained in the first shift register 1 and the second shift register 2.

The flip-flop comprises the data signal input terminal D, the asynchronous set terminal S, the clock signal input terminal, the data signal output terminal Q, a first transfer gate 41, a first NOR circuit 42, a first inverter circuit 43, a second transfer gate 44, a third transfer gate 45, a second NOR circuit 46, a second inverter circuit 47, and a fourth transfer gate 48.

The data signal input terminal D is connected to the first transfer gate 41 which is controlled in response to the shift clock signal 17 (FIGS. 2A and 2B).

The output of the first transfer gate 41 is divided into two outputs. One of the two outputs is connected via the first NOR circuit 42 to the first inverter circuit 43. The other output is connected to the second transfer gate 44 which is controlled in response to the shift clock signal 17. The asynchronous set terminal S is connected to the first NOR circuit 42.

The output of the first inverter circuit 43 and the output of the second transfer gate 44 are joined together into one output which is connected to the third transfer gate 45 which is controlled in response to the shift clock signal 17.

The output of the third transfer gate 45 is divided into two outputs. One of the two outputs is connected via the second NOR circuit 46 to the second inverter circuit 47. The other output is connected to the fourth transfer gate 48, which is controlled in response to the shift clock signal 17. The asynchronous set terminal S is connected to the second NOR circuit 46.

The output of the second inverter circuit 47 and the output of the fourth transfer gate 48 are joined together into one output which is connected to the data signal output terminal Q.

When a logic value indicated by a signal input via the asynchronous set terminal S is a logic value '0', data indicated by a data signal, which is input via the data signal input terminal D at the time of a rising of the shift clock signal 17, is stored and held at the data signal output terminal Q. When a logic value indicated by a signal input via the asynchronous set terminal S is a logic value '1', the data signal output terminal Q is set to a logic value '1'.

Hereinafter, an operation of the parallel/serial conversion circuit 100 of Embodiment 1 of the present invention will be described.

Figure 4:
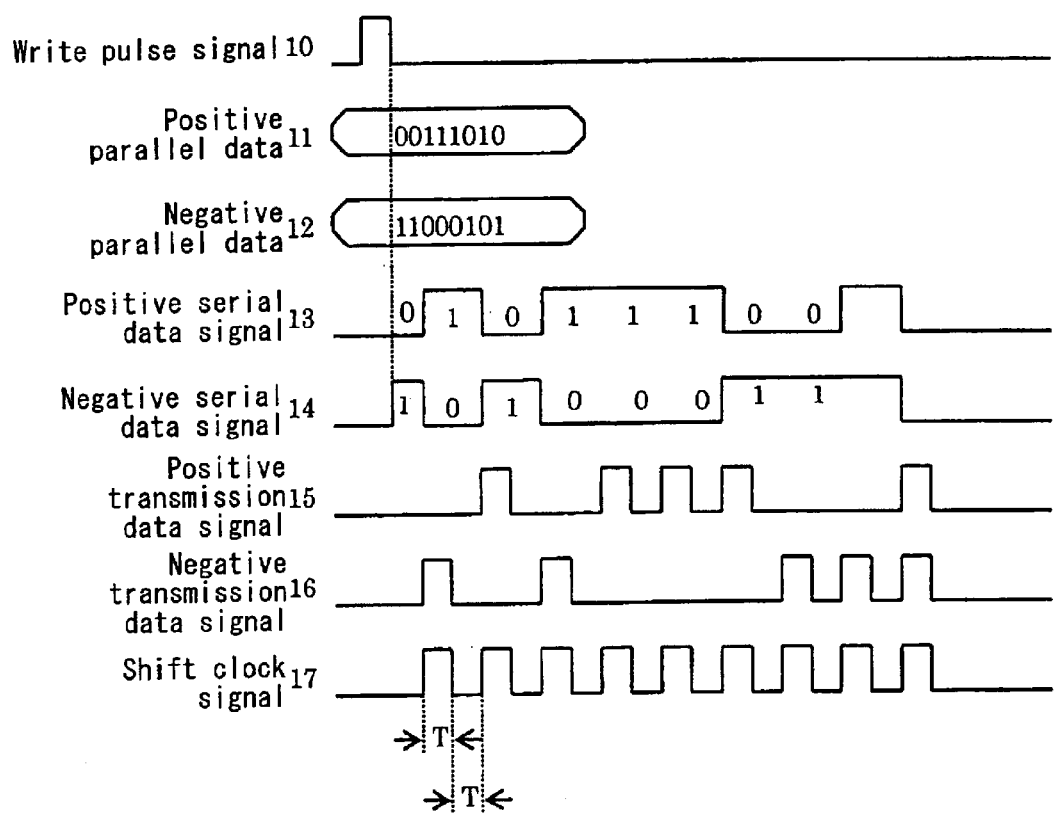
FIG. 4 is a diagram showing signal waveforms for explaining an operation of the parallel/serial conversion circuit 100 of Embodiment 1 of the present invention.

FIG. 4 shows signal waveforms for explaining an operation of the parallel/serial conversion circuit 100 of Embodiment 1 of the present invention.

When the write pulse signal 10 indicates a logic value '1', the positive parallel data 11 is written into the first shift register 1 and the negative parallel data 12 is written into the second shift register 2 (FIGS. 2A and 2B). The negative parallel data 12 is obtained by inverting the bits of the positive parallel data 11.

When the write pulse signal 10 indicates a logic value '1', the positive serial data signal 13 output from the first shift register 1 and the negative serial data signal 14 output from the second shift register 2 each indicate a logic value '0'. When the write pulse signal 10 is transitioned to the logic value '0', a signal indicating the first bit of the 8-bit positive serial data 11 is output from the first shift register 1. Also, when the write pulse signal 10 is transitioned to the logic value '0', a signal indicating the first bit of the 8-bit negative serial data 13 is output from the second shift register 2.

When the bit data of the positive and negative serial data 11 and 12 are output in ascending order from the least significant bit, the first bit is the least significant bit.

When the positive serial data signal 13 indicates a logic value '0' and the negative serial data signal 14 indicates a logic value '1', a signal input to the first pulse generation circuit 20 indicates a logic value '0' and a signal input to the second pulse generation circuit 21 indicates a logic value '1'.

When the positive serial data signal 13 input to the first pulse generation circuit 20 indicates a logic value '0', the positive transmission data signal 15 output from the first pulse generation circuit 20 indicates a logic value '0'. When the negative serial data signal 14 input to the second pulse generation circuit 21 indicates a logic value '1', the negative transmission data signal 16 output from the second pulse generation circuit 21 indicates a logic value '1'.

When the shift clock signal 17 output from the combination circuit 5 to the first AND circuit 3 indicates a logic value '0', a logic value indicated by the negative transmission data signal 16 output from the second pulse generation circuit 21 is changed to '1' time T after the negative serial data signal 14 indicating a logic value '1' is input to the second pulse generation circuit 21.

When the positive serial data signal 13 indicates a logic value '1' and the negative serial data signal 14 indicates a logic value '0', a signal input to the first pulse generation circuit 20 indicates a logic value '1' and a signal input to the second pulse generation circuit 21 indicates a logic value '0'.

When the positive serial data signal 13 input to the first pulse generation circuit 20 indicates a logic value '1', the positive transmission data signal 15 output from the first pulse generation circuit 20 indicates a logic value '1'. When the negative serial data signal 14 input to the second pulse generation circuit 21 indicates a logic value '0', the negative transmission data signal 16 output from the second pulse generation circuit 21 indicates a logic value '0'.

When the shift clock signal 17 output from the combination circuit 5 to the first AND circuit 3 indicates a logic value '0', a logic value indicated by the positive transmission data signal 15 output from the first pulse generation circuit 20 is changed to '1' time T after the positive serial data signal 13 indicating a logic value '1' is input to the first pulse generation circuit 20.

When one of the positive serial data signal 13 and the negative serial data signal 14 indicates a logic value '1', the shift clock signal 17 output from the combination circuit 5 indicates a logic value '1'.

The shift clock signal 17 output from the combination circuit 5 is input to the first shift register 1 and the second shift register 2. The shift clock signal 17 output from the combination circuit 5 is inverted and input to the first AND circuit 3 and the second AND circuit 4.

The shift clock signal 17 indicates the logical addition of a logic value indicated by the positive transmission data signal 15 and a logic value indicated by the negative transmission data signal 16. Time T after a logic value indicated by the shift clock signal 17 indicates a logic value '1', the positive transmission data signal 15 and the negative transmission data signal 16 each indicate a logic value '0' and the shift clock signal 17 also indicates a logic value '0'.

When a logic value indicated by the shift clock signal 17 is changed from a logic value '0' to a logic value '1', the first shift register 1 and the second shift register 2 shift bit data. A signal indicating a data bit shifted by the first shift register 1 is output as the positive serial data signal 13 from the first shift register 1. A signal indicating a data bit shifted by the second shift register 2 is output as the negative serial data signal 14 from the second shift register 2.

Data indicated by the positive serial data signal 13 is inverse to data indicated by negative serial data signal 14 in terms of the bit value. Therefore, during the time when all 8-bit bit data is shifted, either of a logic value indicated by the positive transmission data signal 15 and a logic value indicated by the negative transmission data signal 16 is '1'.

The first shift register 1 and the second shift register 2 each store data at a 9th bit. A signal indicated by the 9th bit data indicates a logic value '1'. Therefore, after all 8-bit bit data has been shifted, the positive transmission data signal 15 and the negative transmission data signal 16 each indicate a logic value '1'. In response to the shift clock signal 17 at a 9th cycle, the positive serial data signal 13 and the negative serial data signal 14 each indicate a logic value '0' and the generation of pulses is stopped. In this case, the logic value '1' of the 9th bit contained in the positive serial data signal 13 acts as a "first end data signal indicating the end of the first serial data" and the logic value '1' of the 9th bit contained in the negative serial data signal 14 acts as a "second end data signal indicating the end of the second serial data".

Note that the structure of the parallel/serial conversion circuit 100 is not limited to that which is described in FIG.

2A. The parallel/serial conversion circuit 100 may comprise an inverter serial circuit.

FIG. 2B shows a structure of another parallel/serial conversion circuit 100' according to Embodiment 1 of the present invention.

The parallel/serial conversion circuit 100' comprises an inverter serial circuit 120. The structure of the parallel/serial conversion circuit 100' is the same as that of the parallel/serial conversion circuit 100 of Embodiment 1, except for the inverter serial circuit 120.

As described above, in the parallel/serial conversion circuit 100, the delay time T of the positive transmission data signal 15 is the sum of a delay time caused by the first drive circuit 101 and a delay time caused by the first AND circuit 3, while the delay time T of the negative transmission data signal 16 is the sum of a delay time caused by the second drive circuit 102 and a delay time caused by the second AND circuit 4. On the other hand, in the parallel/serial conversion circuit 100', the delay time of the positive transmission data signal 15 or the negative transmission data signal 16 can be changed.

The inverter serial circuit 120 is connected to the output of the combination circuit 5.

By providing the inverter serial circuit 120 to the parallel/serial conversion circuit 100', the delay time T of the positive transmission data signal 15 can be changed to the sum of a delay time T1 caused by the inverter serial circuit 120 and a delay time T2 caused by the first drive circuit 101, while the delay time T of the negative transmission data signal 16 can be changed to the sum of the delay time T1 caused by the inverter serial circuit 120 and the delay time T2 caused by the second drive circuit 102.

For example, in the embodiment shown in FIG. 2B, the inverter serial circuit 120 acts as a "delay circuit for determining a delay time of a shift clock signal". However, a delay circuit which can be used in the parallel/serial conversion circuit 100' may have any configuration which can provide the function of the above-described "delay circuit for determining a delay time of a shift clock signal".

Note that although a bit value '1' and a logic value '1' correspond to a voltage level 'HIGH' while a bit value '0' and a logic value '0' correspond to a voltage level 'LOW' in Embodiment 1 of the present invention, the present invention is not limited to this. A bit value '1' and a logic value '1' may correspond to a voltage level 'LOW' while a bit value '0' and a logic value '0' may correspond to a voltage level 'HIGH'.

(Embodiment 2)

A description will be given of a serial data transmission system according to Embodiment 2 of the present invention, in which a signal indicating serial data is transmitted from a serial data transmission section to a serial data reception section via two transmission paths. The serial data transmission section comprises the parallel/serial conversion circuit 100 (FIG. 1) for converting 8-bit parallel data to 8-bit serial data.

Figure 5:
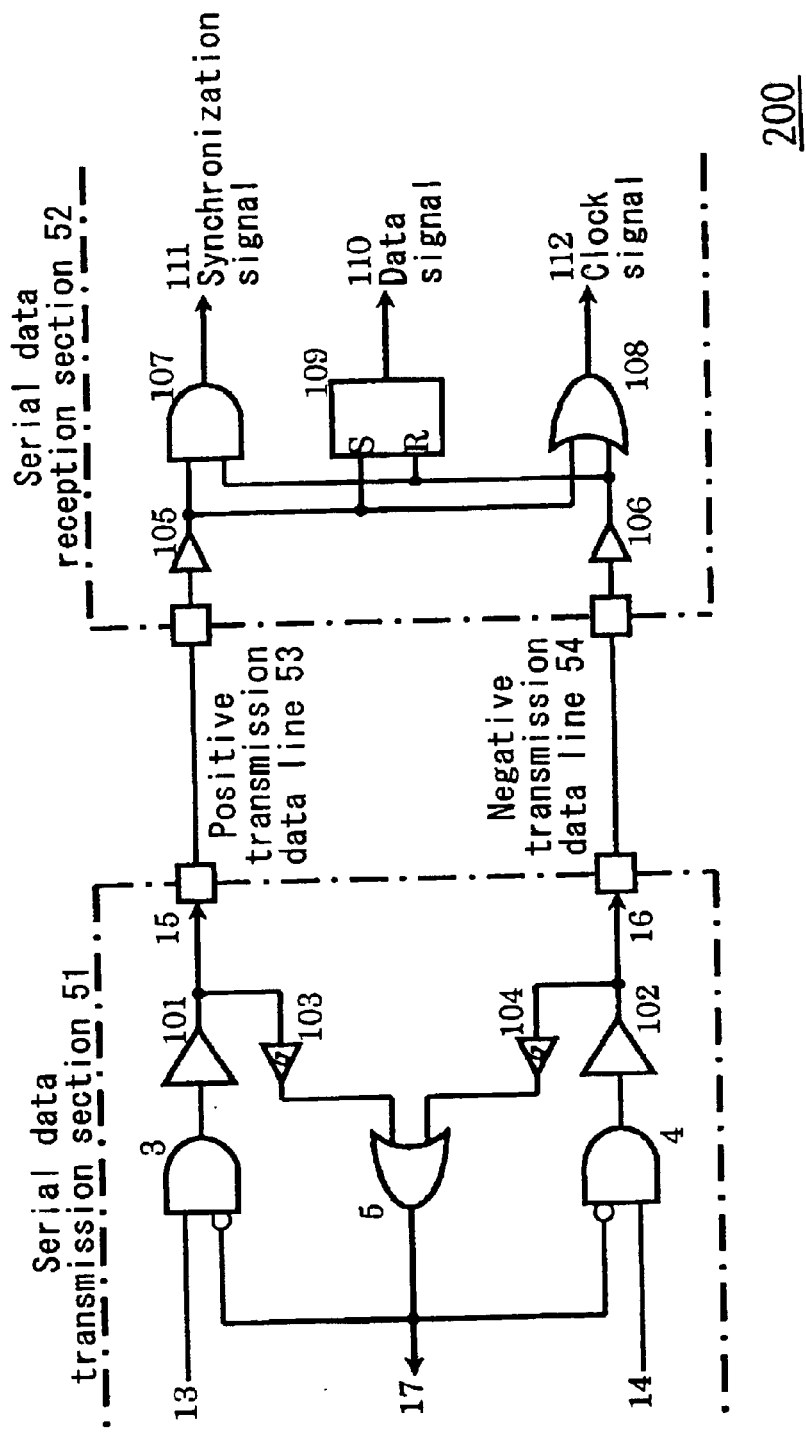
FIG. 5 is diagram showing a structure of a serial data transmission system 200 according to Embodiment 2 of the present invention.

FIG. 5 shows a structure of a serial data transmission system 200 according to Embodiment 2 of the present invention.

The serial data transmission system 200 comprises a serial data transmission section 51, a serial data reception section 52, a positive transmission data signal line 53, and a negative transmission data signal line 54.

The serial data transmission section 51 is, for example, the parallel/serial conversion circuit 100 (FIG. 1). In FIG. 5, for the sake of simplicity, the first shift register 1 and the second shift register 2 are not shown.

The first drive circuit 101 drives the voltage level of the positive transmission data signal 15 to a low level voltage corresponding to a logic value '0' or a high level voltage corresponding to a logic value '1'. The positive transmission data signal 15 is input to the first Schmidt trigger circuit 103. When the positive transmission data signal 15 input to the first Schmidt trigger circuit 103 has a voltage level between a voltage level corresponding to a logic value '0' and a voltage level corresponding to a logic value '1', the first Schmidt trigger circuit 103 regulates the logic value of the signal so that a logic value indicated by a signal output by the first Schmidt trigger circuit 103 holds a logic value indicated by a signal output by the first AND circuit 3.

The second drive circuit 102 drives the voltage level of the negative transmission data signal 16 to a low level voltage corresponding to a logic value '0' or a high level voltage corresponding to a logic value '1'. The negative transmission data signal 16 is input to the second Schmidt trigger circuit 104. When the negative transmission data signal 16 input to the second Schmidt trigger circuit 104 has a voltage level between a voltage level corresponding to a logic value '0' and a voltage level corresponding to a logic value '1', the second Schmidt trigger circuit 104 regulates the logic value of the signal so that a logic value indicated by a signal output by the second Schmidt trigger circuit 104 holds a logic value indicated by a signal output by the second AND circuit 4.

The first Schmidt trigger circuit 103 is connected to an input of the combination circuit 5. The second Schmidt trigger circuit 104 is also connected to an input of the combination circuit 5. A signal output from the combination circuit 5 is input as the shift clock signal 17 to the first shift register 1 and the second shift register 2.

As described above, the serial data transmission section 51 generates the positive transmission data signal 15 and the negative transmission data signal 16 which have a pulse width and a pulse amplitude suitable for the load of the transmission path.

The serial data reception section 52 comprises a first reception circuit 105, a second reception circuit 106, an AND circuit 107, an OR circuit 108, and a register 109.

The positive transmission data signal 15 output from the serial data transmission section 51 is input to the first reception circuit 105. The first reception circuit 105 determines whether the voltage level of the received positive transmission data signal 15 is a voltage level corresponding to a logic value '0' or a voltage level corresponding to a logic value '1'.

The negative transmission data signal 16 output from the serial data transmission section 51 is input to the second reception circuit 106. The second reception circuit 106 determines whether the voltage level of the received negative transmission data signal 16 is a voltage level corresponding to a logic value '0' or a voltage level corresponding to a logic value '1'.

The register 109 comprises an asynchronous set terminal S and an asynchronous reset terminal R. The output of the first reception circuit 105 is connected to the asynchronous set terminal S of the register 109. A signal output from the first reception circuit 105 is input to the asynchronous set terminal S of the register 109. The output of the second reception circuit 106 is connected to the asynchronous reset terminal R of the register 109. A signal output from the second reception circuit 106 is input to the asynchronous reset terminal R of the register 109.

When the positive transmission data signal 15 input to the asynchronous set terminal S of the register 109 indicates a logic value '1', the register 109 sets a data signal 110, which is output from the register 109, to a logic value '1'. When the negative transmission data signal 16 input to the asynchronous reset terminal R of the register 109 indicates a logic value '1', the register 109 resets the data signal 110 to a logic value '0'. The register 109 outputs the data signal 110. The data signal 110 may act as a "serial data signal indicating serial data", for example.

A combination of data indicated by the positive transmission data signal 15 and data indicated by the negative transmission data signal 16 indicates bit separation, a logic value '0', or a logic value '1'. For example, when a combination of the data indicated by the positive transmission data signal 15 and the data indicated by the negative transmission data signal 16 is (0, 0), bit separation is indicated; when (0, 1), a logic value '0' is indicated; and when (1, 0), a logic value '1' is indicated.

The output of the first reception circuit 105 and the output of the second reception circuit 106 are each connected to the AND circuit 107. Thus, a signal output from the first reception circuit 105 and a signal output from the second reception circuit 106 are each input to the AND circuit 107.

The AND circuit 107 obtains the logical product of a logic value indicated by a signal input from the first reception circuit 105 to the AND circuit 107 and a logic value indicated by a signal input from the second reception circuit 106 to the AND circuit 107, and outputs a signal indicating the logical product as a synchronization signal 111. The synchronization signal 111 indicates the end of data.

When a signal input from the first reception circuit 105 to the AND circuit 107 indicates a logic value '1' and a signal input from the second reception circuit 106 to the AND circuit 107 indicates a logic value '1', the synchronization signal 111 indicates a logic value '1'. When at least one of a signal input from the first reception circuit 105 to the AND circuit 107 and a signal input from the second reception circuit 106 to the AND circuit 107 indicates a logic value '0', the synchronization signal 111 indicates a logic value '0'.

The output of the first reception circuit 105 and the output of the second reception circuit 106 are each connected to the OR circuit 108. A signal output from the first reception circuit 105 and a signal output from the second reception circuit 106 are each input to the AND circuit 108.

The OR circuit 108 obtains the logical addition of a logic value indicated by a signal input from the first reception circuit 105 to the OR circuit 108 and a logic value indicated by a signal input from the second reception circuit 106 to the OR circuit 108, and outputs a signal indicating the logical addition as a clock signal 112. The clock signal 112 separates one bit from another in bits of serial data.

When a signal input from the first reception circuit 105 to the OR circuit 108 indicates a logic value '0' and a signal input from the second reception circuit 106 to the OR circuit 108 indicates a logic value '0', the clock signal 112 indicates a logic value '0'. When at least one of a logic value indicated by a signal input from the first reception circuit 105 to the OR circuit 108 and a logic value indicated by a signal input from the second reception circuit 106 to the OR circuit 108 indicates a logic value '1', the clock signal 112 indicates a logic value '1'.

Hereinafter, an operation of the serial data transmission system 200 according to Embodiment 2 of the present invention will be described.

Figure 6:
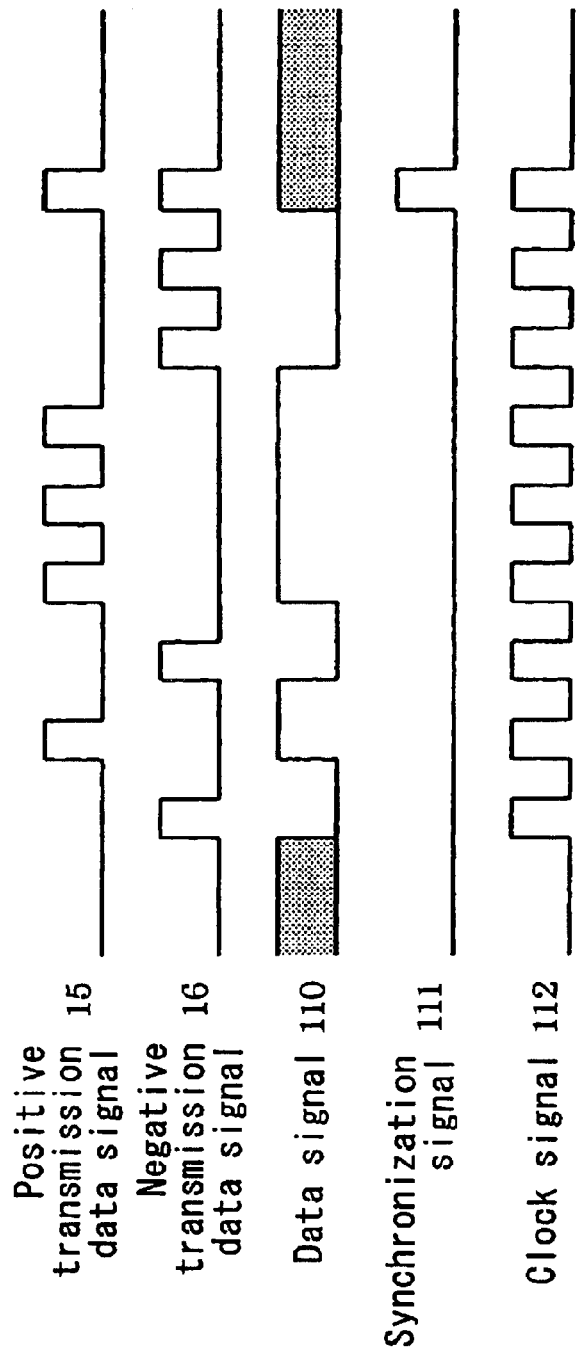
FIG. 6 is a diagram showing signal waveforms for explaining an operation of the serial data transmission system 200 according to Embodiment 2 of the present invention.
Figure 7:
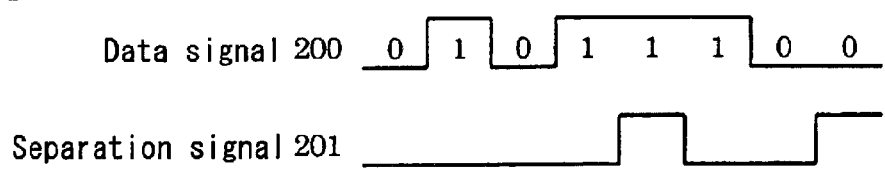
FIG. 7 is a diagram showing signal waveforms for explaining a conventional serial data transmission method.

FIG. 6 shows signal waveforms for explaining the operation of the serial data transmission system 200 according to Embodiment 2 of the present invention.

When the positive transmission data signal 15 input to the asynchronous set terminal S of the register 109 indicates a logic value '1', the register 109 sets a data signal 110, which is output from the register 109, to a logic value '1'. When the negative transmission data signal 16 input to the asynchronous reset terminal R of the register 109 indicates a logic value '1', the register 109 resets the data signal 110 to a logic value '0'. The register 109 outputs the data signal 110.

The positive transmission data signal 15 input to the asynchronous set terminal S of the register 109 indicates a logic value '1' when a pulse of the positive transmission data signal 15 is, for example, at a HIGH level '1'. The negative transmission data signal 16 input to the asynchronous reset terminal R of the register 109 indicates a logic value '1' when a pulse of the negative transmission data signal 16 indicates a HIGH level '1'.

When the positive transmission data signal 15 input to the asynchronous set terminal S of the register 109 indicates a logic value '0' and the negative transmission data signal 16 input to the asynchronous reset terminal R of the register 109 indicates a logic value '0', the register 109 does not change the logic value of the data signal 110, which is output from the register 109.

When the positive transmission data signal 15 input to the asynchronous set terminal S of the register 109 indicates a logic value '0' and the negative transmission data signal 16 input to the asynchronous reset terminal R of the register 109 indicates a logic value '0', the register 109 determines that this combination of the signals indicates a signal for separating one bit from another and does not change the logic value of the data signal 110, which is output from the register 109.

When the positive transmission data signal 15 input from the first reception circuit 105 to the AND circuit 107 indicates a logic value '1' and the negative transmission data signal 16 input from the second reception circuit 106 to the AND circuit 107 indicates a logic value '1', the AND circuit 107 outputs the synchronization signal 111. For example, a pulse indicating the positive transmission data signal 15 is input from the first reception circuit 105 to the AND circuit 107 and a pulse indicating the negative transmission data signal 16 is input from the second reception circuit 106 to the AND circuit 107, the AND circuit 107 generates a pulse indicating the synchronization signal 111.

When at least one of a logic value indicated by the positive transmission data signal 15 input from the first reception circuit 105 to the OR circuit 108 and a logic value indicated by the negative transmission data signal 16 input from the second reception circuit 106 to the OR circuit 108 indicates a logic value '1', the OR circuit 108 outputs the clock signal 112. For example, when a pulse indicating the positive transmission data signal 15 input from the first reception circuit 105 to the OR circuit 108 and a pulse indicating the negative transmission data signal 16 input from the second reception circuit 106 to the OR circuit 108 are input to the OR circuit 108, the OR circuit 108 outputs a pulse indicating the clock signal 112.

According to the serial data transmission system 200, for example, it is possible to input the data signal 110 as serial data to a shift register in response to the clock signal 112.

According to the serial data transmission system 200, for example, serial data input to a shift register can be output as parallel data from the shift register in response to the synchronization signal 111.

As described above, in the embodiment shown in FIGS. 5 and 6, the register 109 acts as a "serial data generation section for generating serial data by combining first serial data and second serial data generated by a parallel/serial conversion circuit". Also, the AND circuit 107 acts as a "synchronization signal generation section for generating a synchronization signal based on a combination of a first end data signal contained in a signal indicating first serial data and a second end data signal contained in a signal indicating second serial data". Also, the OR circuit 108 acts as a "clock signal generation circuit for generating a clock signal based on a combination of a first pulse signal contained in a signal indicating first serial data and a second pulse signal contained in a signal indicating second serial data". The serial data generation circuit, the synchronization signal generation circuit, and the clock signal generation circuit are not limited to the circuit configurations shown in FIG. 5. The serial data generation circuit may have any circuit configuration which can generate serial data. The synchronization circuit may have any circuit configuration which can generate a synchronization signal. The clock signal generation circuit may have any circuit configuration which can generate a clock signal.

The parallel/serial conversion circuit of the present invention combines first serial data and second serial data, a combination of which indicates bit separation, a logic value '0', or a logic value '1', to generate a shift clock signal. The parallel/serial conversion circuit of the present invention shifts the first parallel data in response to the generated shift clock signal, thereby converting the first parallel data to first serial data. Also, the parallel/serial conversion circuit of the present invention shifts the second parallel data in response to the generated shift clock signal, thereby converting the second parallel data to second serial data.

As a result, the parallel/serial conversion circuit of the present invention can generate a shift clock signal by itself and convert parallel data to serial data in response to the generated shift clock signal.

The parallel/serial conversion circuit of the present invention need not receive an external shift clock signal and can generate a shift clock signal by itself. Thus, the parallel/serial conversion circuit need not be provided with a clock generation circuit, a clock division circuit, or the like.

When serial data is not generated, generation of a shift clock signal can be completely stopped. Therefore, it is possible to reduce power consumption.

According to the serial data reception device of the present invention, a synchronization signal and a clock signal can be generated based on a combination of a positive transmission data signal and a negative transmission data signal. Therefore, for example, serial data can be input serially into a shift register in response to the clock signal, thereby making it possible to output parallel data in response to the synchronization signal.

According to the serial data transmission system of the present invention, a data signal, a bit separation signal (clock signal), and a synchronization signal can be transmitted via two signal lines (a signal line for transmitting a positive transmission data signal and a signal line for transmitting a negative transmission data signal). Therefore, the number of terminals of a serial data transmission device and the number of terminals of a serial data reception device can be each two.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A parallel/serial conversion circuit, comprising:

a parallel/serial conversion section for converting first parallel data to first serial data and converting second parallel data to second serial data; and a shift clock signal generation section for generating a shift clock signal, wherein the parallel/serial conversion section converts the first parallel data to the first serial data by shifting the first parallel data in response to the shift clock signal, the parallel/serial conversion section converts the second parallel data to the second serial data by shifting the second parallel data in response to the shift clock signal, a combination of the first serial data and the second serial data indicates bit separation, a logic value '0', or a logic value '1', and the shift clock signal generation section generates the shift clock signal by combining the first serial data and the second serial data.

2. A parallel/serial conversion circuit according to claim 1, wherein:

the parallel/serial conversion section comprises a first shift register, a second shift register, a first pulse generation circuit, and a second pulse generation circuit;

the first and second parallel data each contain a plurality of bits;

the first serial data and second serial data are inverse to each other in terms of the bit value;

the first shift register shifts the first parallel data stored therein on a bit-by-bit basis in response to the shift clock signal to convert the first parallel data to third serial data;

the second shift register shifts the second parallel data stored therein on a bit-by-bit basis in response to the shift clock signal to convert the second parallel data to fourth serial data;

the first pulse generation circuit, receives the third serial data and converts the third serial data to the first serial data based on each bit contained in the third serial data; and the second pulse generation circuit receives, the fourth serial data and converts the fourth serial data to the second serial data based on each bit contained in the fourth serial data.

3. A parallel/serial conversion circuit according to claim 1, wherein a signal indicating the first serial data contains a first end data signal indicating an end of the first serial data, and a signal indicating the second serial data contains a second end data signal indicating an end of the second serial data.

4. A parallel/serial conversion circuit according to claim 1, further comprising a delay circuit for determining a delay time of the shift clock signal.

5. A serial data generation circuit for generating serial data containing a plurality of bits, comprising:

a serial data generation section for combining first serial data and second serial data generated by a parallel/serial conversion, circuit to generate the serial data, wherein a serial data signal indicating the serial data includes a signal for separating one bit from another in the plurality of bits contained in the serial data, and the parallel/serial conversion circuit comprises
a parallel/serial conversion section for generating the first serial data by converting first parallel data to the first serial data and generating the second serial data by converting second parallel data to the second serial data; and
a shift clock signal generation section for generating a shift clock signal,
wherein the parallel/serial conversion section converts the first parallel data to the first serial data by shifting the first parallel data in response to the shift clock signal,
the parallel/serial conversion section converts the second parallel data to the second serial data by shifting the second parallel data in response to the shift clock signal,
a combination of the first serial data and the second serial data indicates bit separation, a logic value '0', or a logic value '1', and
the shift clock signal generation section generates the shift clock signal by combining the first serial data and the second serial data.

6. A synchronization signal generation circuit for generating a synchronization signal indicating an end of serial data, wherein the serial data is generated by combining first serial data and second serial data generated by a parallel/serial conversion circuit, the synchronization signal generation circuit comprising:
a synchronization signal generation section for generating the synchronization signal based on a combination of a first end data signal contained in a signal indicating the first serial data and a second end data signal contained in a signal indicating the second serial data,
wherein the first end data signal indicates an end of the first serial data and the second end data signal indicates an end of the second serial data, and
the parallel/serial conversion circuit comprises:
a parallel/serial conversion section for generating the first serial data by converting first parallel data to the first serial data and generating the second serial data by converting second parallel data to the second serial data; and
a shift clock signal generation section for generating a shift clock signal,
wherein the parallel/serial conversion section converts the first parallel data to the first serial data by shifting the first parallel data in response to the shift clock signal,
the parallel/serial conversion section converts the second parallel data to the second serial data by shifting the second parallel data in response to the shift clock signal,
a combination of the first serial data and the second serial data indicates bit separation, a logic value '0', or a logic value '1', and
the shift clock signal generation section generates the shift clock signal by combining the first serial data and the second serial data.

7. A clock signal generation circuit for generating a clock signal, wherein the clock signal separates one bit from another in a plurality of bits contained in serial data, and the serial data is generated by combining first serial data and second serial data generated by a parallel/serial conversion circuit, the clock signal generation circuit comprising:
a clock signal generation section for generating the clock signal based on a combination of a first pulse signal contained in a signal indicating the first serial data and a second pulse signal contained in a signal indicating the second serial data.
wherein the first pulse signal and the second pulse signal separate one bit from another in a plurality of bits contained in the serial data, and
the parallel/serial conversion circuit comprises:
a parallel/serial conversion section for generating the first serial data by converting first parallel data to the first serial data and generating the second serial data by converting second parallel data to the second serial data; and
a shift clock signal generation section for generating a shift clock signal,
wherein the parallel/serial conversion section converts the first parallel data to the first serial data by shifting the first parallel data in response to the shift clock signal,
the parallel/serial conversion section converts the second parallel data to the second serial data by shifting the second parallel data in response to the shift clock signal,
a combination of the first serial data and the second serial data indicates bit separation, a logic value '0', or a logic value '1', and
the shift clock signal generation section generates the shift clock signal by combining the first serial data and the second serial data.

8. A serial data transmission device, comprising:
a parallel/serial conversion circuit comprising:
a parallel/serial conversion section for converting first parallel data to first serial data and converting second parallel data to second serial data; and
a shift clock signal generation section for generating a shift clock signal,
wherein the parallel/serial conversion section converts the first parallel data to the first serial data by shifting the first parallel data in response to the shift clock signal,
the parallel/serial conversion section converts the second parallel data to the second serial data by shifting the second parallel data in response to the shift clock signal,
a combination of the first serial data and the second serial data indicates bit separation, a logic value '0', or a logic value '1', and
the shift clock signal generation section generates the shift clock signal by combining the first serial data and the second serial data.

9. A serial data reception device, comprising:
a serial data generation circuit for generating serial data containing a plurality of bits;
a synchronization signal generation circuit for generating a synchronization signal indicating an end of the serial data; and
a clock signal generation circuit for generating a clock signal,
wherein the serial data generation circuit generates the serial data by combining the first serial data and the second serial data generated by a parallel/serial conversion circuit,
a serial data signal indicating the serial data includes a bit separation signal separating one bit from another in the plurality of bits contained in the serial data,
the synchronization signal generation circuit generates the synchronization signal based on a combination of the first end data signal contained in a signal indicating the first serial data and a second end data signal contained in a signal indicating the second serial data, the first end data signal indicates an end of the first serial data and the second end data signal indicates an end of the second serial data, the clock signal generation circuit generates the clock signal based on a combination of a first pulse signal contained in the signal indicating the first serial data and a second pulse signal contained in the signal indicating the second serial data, the clock signal separates one bit from another in the plurality of bits contained in the serial data, the first pulse signal and the second pulse signal separate one bit from another in a plurality of bits contained in the serial data, and the parallel/serial conversion circuit comprises:

a parallel/serial conversion section for generating the first serial data by converting first parallel data to the first serial data and generating the second serial data by converting second parallel data to the second serial data; and a shift clock signal generation section for generating a shift clock signal, wherein the parallel/serial conversion section converts the first parallel data to the first serial data by shifting the first parallel data in response to the shift clock signal, the parallel/serial conversion section converts the second parallel data to the second serial data by shifting the second parallel data in response to the shift clock signal, a combination of the first serial data and the second serial data indicates bit separation, a logic value '0', or a logic value '1', and the shift clock signal generation section generates the shift clock signal by combining the first serial data and the second serial data.

10. A serial data transmission system, comprising:

a serial data transmission device comprising a parallel/serial conversion circuit for generating first serial data and second serial data;

a serial data reception device for receiving the first serial data and the second serial data;

a first transmission path for transmitting the first serial data from the serial data transmission device to the serial data reception device; and a second transmission path for transmitting the second serial data from the serial data reception device to the serial data transmission device, wherein the parallel/serial conversion circuit comprises:

a parallel/serial conversion section for generating the first serial data by converting first parallel data to the first serial data and generating the second serial data by converting second parallel data to the second serial data; and a shift clock signal generation section for generating a shift clock signal, wherein the parallel/serial conversion section converts the first parallel data to the first serial data by shifting the first parallel data in response to the shift clock signal, the parallel/serial conversion section converts the second parallel data to the second serial data by shifting the second parallel data in response to the shift clock signal, a combination of the first serial data and the second serial data indicates bit separation, a logic value '0', or a logic value '1', and the shift clock signal generation section generates the shift clock signal by combining the first serial data and the second serial data, the serial data reception device comprises a serial data generation circuit for generating serial data containing a plurality of bits, a synchronization signal generation circuit for generating a synchronization signal indicating an end of the serial data, and a clock signal generation circuit for generating a clock signal, the serial data generation circuit generates the serial data by combining the first serial data and the second serial data, a serial data signal indicating the serial data includes a bit separation signal separating one bit from another in the plurality of bits contained in the serial data, the synchronization signal generation circuit generates the synchronization signal based on a combination of the first end data signal contained in a signal indicating a first serial data and a second end data signal contained in a signal indicating the second serial data, the first end data signal indicates an end of the first serial data and the second end data signal indicates an end of the second serial data, the clock signal generation circuit generates the clock signal based on a combination of a first pulse signal contained in the signal indicating the first serial data and a second pulse signal contained in the signal indicating the second serial data.

the clock signal separates one bit from another in the plurality of bits contained in the serial data, the first pulse signal separates and the second pulse signal separate one bit from another in a plurality of bits contained in the serial data.

* * * * *